United States Patent
Togashi

(10) Patent No.: US 10,090,186 B2
(45) Date of Patent: Oct. 2, 2018

(54) CHUCK TABLE

(71) Applicant: DISCO CORPORATION, Tokyo (JP)

(72) Inventor: Ken Togashi, Tokyo (JP)

(73) Assignee: Disco Corporation, Tokyo (JP)

( * ) Notice: Subject to any disclaimer, the term of this patent is extended or adjusted under 35 U.S.C. 154(b) by 52 days.

(21) Appl. No.: 15/243,291

(22) Filed: Aug. 22, 2016

(65) Prior Publication Data

US 2017/0069524 A1    Mar. 9, 2017

(30) Foreign Application Priority Data

Sep. 3, 2015    (JP) ................................. 2015-173976

(51) Int. Cl.
*H01L 21/67* (2006.01)
*H01L 21/683* (2006.01)

(52) U.S. Cl.
CPC .... *H01L 21/6838* (2013.01); *H01L 21/67092* (2013.01)

(58) Field of Classification Search
CPC ......... B24B 37/32; B24B 37/00; B24B 37/02; H01L 21/67092; H01L 21/67126; H01L 21/6835; H01L 21/6838
USPC .......... 438/464; 451/285–288; 269/309–310, 269/900, 903
See application file for complete search history.

(56) References Cited

U.S. PATENT DOCUMENTS

| | | | | |
|---|---|---|---|---|
| 2,730,370 A | * | 1/1956 | Brewster | B23B 31/307 264/571 |
| 3,727,282 A | * | 4/1973 | Neary | B28D 5/0011 225/2 |
| 3,743,148 A | * | 7/1973 | Carlson | H01L 21/67092 225/2 |
| 4,410,168 A | * | 10/1983 | Gotman | B25B 11/005 269/21 |
| 5,605,844 A | * | 2/1997 | Oki | G01R 31/287 438/17 |
| 5,624,299 A | * | 4/1997 | Shendon | B24B 37/042 451/28 |
| 6,189,591 B1 | * | 2/2001 | Ariye | H01L 21/67092 156/701 |

(Continued)

FOREIGN PATENT DOCUMENTS

| | | | | |
|---|---|---|---|---|
| JP | 2002-192370 | | 7/2002 | |
| JP | 2007059829 A | * | 3/2007 | H01L 21/78 |

(Continued)

*Primary Examiner* — Joseph J Hail
*Assistant Examiner* — Arman Milanian
(74) *Attorney, Agent, or Firm* — Greer Burns & Crain Ltd.

(57) ABSTRACT

A chuck table holds under suction a front side of a wafer which includes a device region including a plurality of devices, each having a plurality of electrode bumps, formed in a plurality of areas demarcated in a grid pattern, and an outer peripheral extra region surrounding the device region. The chuck table includes a holding surface for facing the electrode bumps and holding under suction the device region of the wafer, and an outer peripheral extra region support surrounding the holding surface and including an elastic member projecting beyond the holding surface for supporting the outer peripheral extra region of the wafer. The outer peripheral extra region support projects from the holding surface by a distance corresponding to the height of the electrode bumps.

1 Claim, 5 Drawing Sheets

(56) References Cited

U.S. PATENT DOCUMENTS

| | | | |
|---|---|---|---|
| 6,466,046 B1 * | 10/2002 | Maruyama | G01R 31/2886 324/754.15 |
| 6,716,084 B2 * | 4/2004 | Basol | B24B 37/30 451/288 |
| 6,939,206 B2 * | 9/2005 | Ashjaee | B24B 37/30 451/286 |
| 9,381,577 B2 * | 7/2016 | Iizuka | B23B 31/307 |
| 2006/0197260 A1 * | 9/2006 | Yoshikawa | B23K 26/10 264/482 |
| 2007/0045799 A1 * | 3/2007 | Sekiya | H01L 21/67132 257/678 |
| 2009/0026676 A1 * | 1/2009 | Kurita | H01L 21/67132 269/21 |
| 2009/0075459 A1 * | 3/2009 | Sato | H01L 21/67132 438/464 |

FOREIGN PATENT DOCUMENTS

| | | | |
|---|---|---|---|
| JP | 2013-229403 | 11/2013 | |
| JP | 2013229403 A * | 11/2013 | H01L 21/78 |

* cited by examiner

CHUCK TABLE

BACKGROUND OF THE INVENTION

Field of the Invention

The present invention relates to a chuck table for use in a processing apparatus such as a laser processing apparatus or the like.

Description of the Related Art

According to a processing method that has started to be used in recent years for semiconductor wafers and optical device wafers wherein a light-emitting layer is formed on an epitaxial substrate made of sapphire, SiC, GaN, or the like, a laser beam which has a wavelength permeable to a wafer to be processed is applied to the wafer while being focused at a point within the wafer, forming a modified layer in the wafer, and then external forces are applied to the wafer to divide the wafer into individual device chips, with the modified layer acting as a fracture starting point (see, for example, Japanese Patent No. 3408805).

The above processing method is subject to the condition that anything (e.g., materials for forming various patterns that make up devices) likely to attenuate the energy of the laser beam should not exist in the wafer surface that is irradiated with the laser beam. Therefore, it has been the general practice to form a modified layer in a wafer having a plurality of devices on a front side thereof by applying a laser beam to the wafer from a back side thereof which is free of any devices.

In order for the back side of the wafer to be irradiated with the laser beam, the front side of the wafer on which the devices are formed needs to be held by a chuck table. There has been known a processing method for covering a holding surface of the chuck table with a sheet member so as to prevent the devices from being broken by direct contact with the holding surface of the chuck table (see Japanese Patent Laid-open No. 2013-229403).

SUMMARY OF THE INVENTION

Some semiconductor devices of the flip chip bonding type have electrode bumps formed on electrodes of the devices, and many such electrode bumps are arrayed on the front side of a semiconductor wafer before it is diced into device chips. When the front side of the semiconductor wafer is to be held under suction on the chuck table, the electrode bumps that protrude on the semiconductor devices are liable to cause a negative pressure leakage and the chuck table fails to exert a sufficient negative pressure on the semiconductor wafer. Consequently, there is a problem that the chuck table is unable to fully attract the semiconductor wafer under suction.

It is therefore an object of the present invention to provide a chuck table which is capable of preventing a negative pressure leakage from occurring and reliably holding a semiconductor wafer under suction when the front side of the semiconductor wafer on which a plurality of electrode bumps are formed is to be attracted under suction to the chuck table.

In accordance with an aspect of the present invention, there is provided a chuck table for holding under suction a front side of a wafer which has a device region including a plurality of devices, each having a plurality of electrode bumps, formed respectively in a plurality of areas demarcated in a grid pattern, and an outer peripheral extra region surrounding the device region, including a holding surface for facing the electrode bumps and holding under suction the device region of the wafer, and an outer peripheral extra region support surrounding the holding surface and including an elastic member projecting beyond the holding surface for supporting the outer peripheral extra region of the wafer, wherein the outer peripheral extra region support projects from the holding surface by a distance corresponding to the height of the electrode bumps.

Preferably, the chuck table further includes a sheet member which is larger in diameter than the wafer and which is flexible and permeable to air, the sheet member covering the holding surface and the outer peripheral extra region support and protecting the front side of the wafer held under suction, and a sheet member holder lowering an outer periphery of the sheet member to a position lower than the outer peripheral extra region support and securing the outer periphery of the sheet member in position. Preferably, the chuck table further includes height adjusting means for adjusting the distance by which the outer peripheral extra region support projects from the holding surface.

With the chuck table according to the present invention, the electrode bumps side of the wafer is held on the holding surface, and the outer peripheral extra region support that projects from the holding surface by the distance corresponding to the height of the electrode bumps provides a seal between the wafer and the holding surface, allowing a sufficient negative pressure to act between the wafer and the holding surface. Therefore, the chuck table is capable of attracting under suction the front side of the wafer where the electrode bumps are present from the electrode bumps side.

Since the front side of the wafer is covered with the sheet member, the front side of the wafer is sufficiently protected when the wafer is held under suction on the chuck table. Even if the height of the electrode bumps is varied because devices of a different type are formed on the front side of the wafer, the height of the outer peripheral extra region support can be adjusted by the height adjusting means. Accordingly, it is not necessary to prepare another chuck table for the different height of the electrode bumps.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
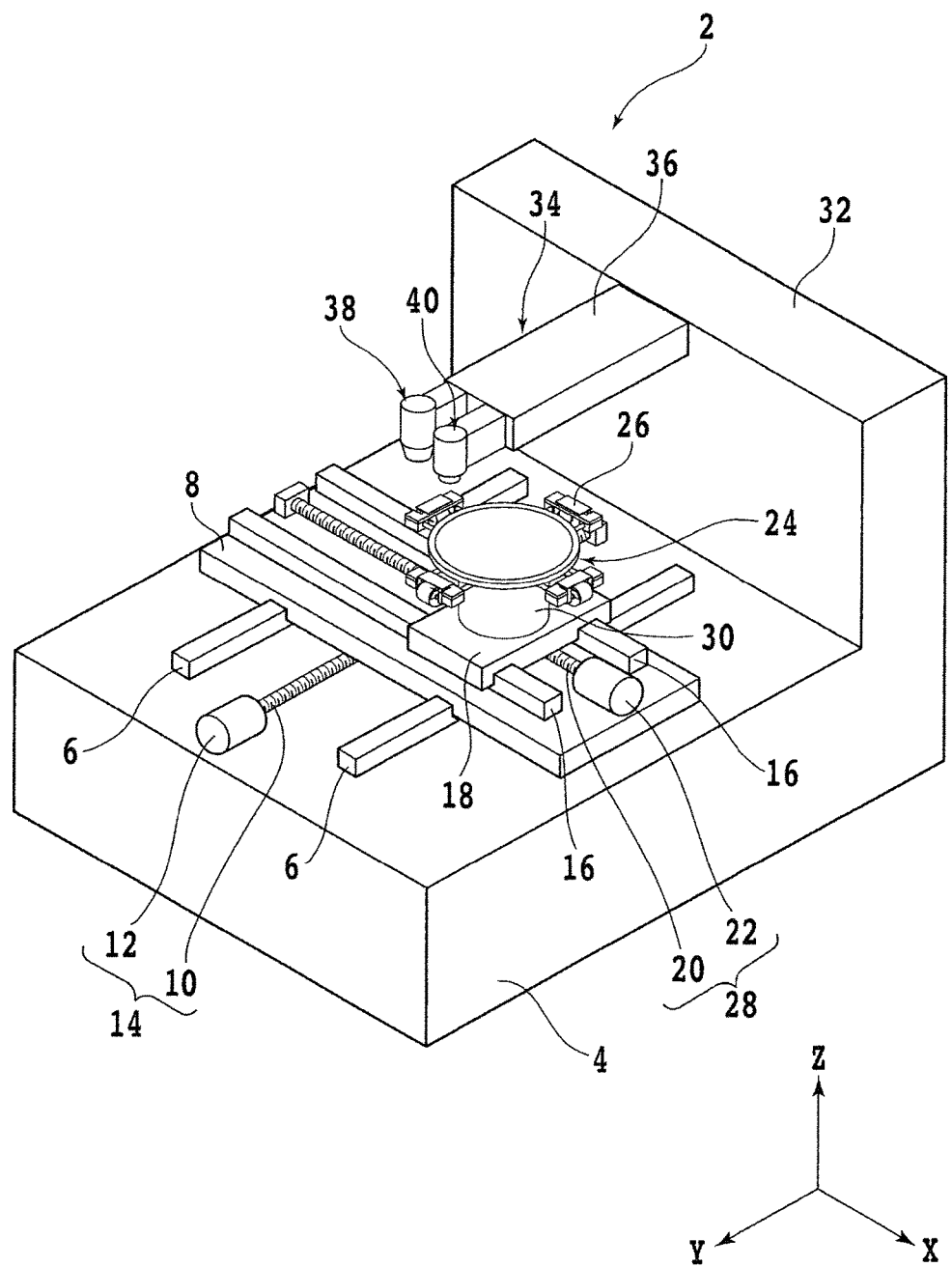
FIG. 1 is a perspective view of a laser processing apparatus to which a chuck table according to an embodiment of the present invention is applicable.

An embodiment of the present invention will be described in detail below with reference to the drawings. FIG. 1 schematically depicts in perspective a laser processing apparatus 2 incorporating a chuck table according to an embodiment of the present invention. The laser processing apparatus 2 includes a pair of guide rails 6 mounted on a stationary base 4 and extending in Y-axis directions. A Y-axis movable block 8 is slidably mounted on the guide rails 6. The Y-axis movable block 8 is moved along the guide rails 6 in indexing feed directions, i.e., the Y-axis directions, by a Y-axis feed mechanism (Y-axis feed means) 14 which includes a ball screw 10 and a pulse motor 12. The Y-axis movable block 8 supports a pair of guide rails 16 fixedly mounted thereon which extend in X-axis directions.

An X-axis movable block 18 is slidably mounted on the guide rails 16. The X-axis movable block 18 is moved along the guide rails 16 in processing feed directions, i.e., the X-axis directions, by an X-axis feed mechanism (X-axis feed means) 28 which includes a ball screw 20 and a pulse motor 22. The X-axis movable block 18 supports a chuck table 24 mounted thereon by a hollow cylindrical support 30. The chuck table 24 includes a plurality of (four in the embodiment) clamps 26 for clamping an annular frame F depicted in FIG. 3.

An upstanding column 32 is disposed on a rear portion of the base 4. A laser beam irradiation unit 34 has a casing 36 fixed to the column 32. The casing 36 houses therein laser beam oscillating means including a YAG laser oscillator, etc. The laser beam irradiation unit 34 includes a beam condenser (laser head) 38 mounted on a tip end of the casing 36 for converging a laser beam onto a semiconductor wafer 11 (FIG. 2) to be processed, and an image capturing unit 40 mounted on the tip end of the casing 36 for capturing an image of the semiconductor wafer 11 that is held on the chuck table 24. The image capturing unit 40 includes an image capturing device capable of capturing infrared radiation images. The beam condenser 38 and the image capturing unit 40 are arranged in an array along the X-axis directions.

Figure 2:
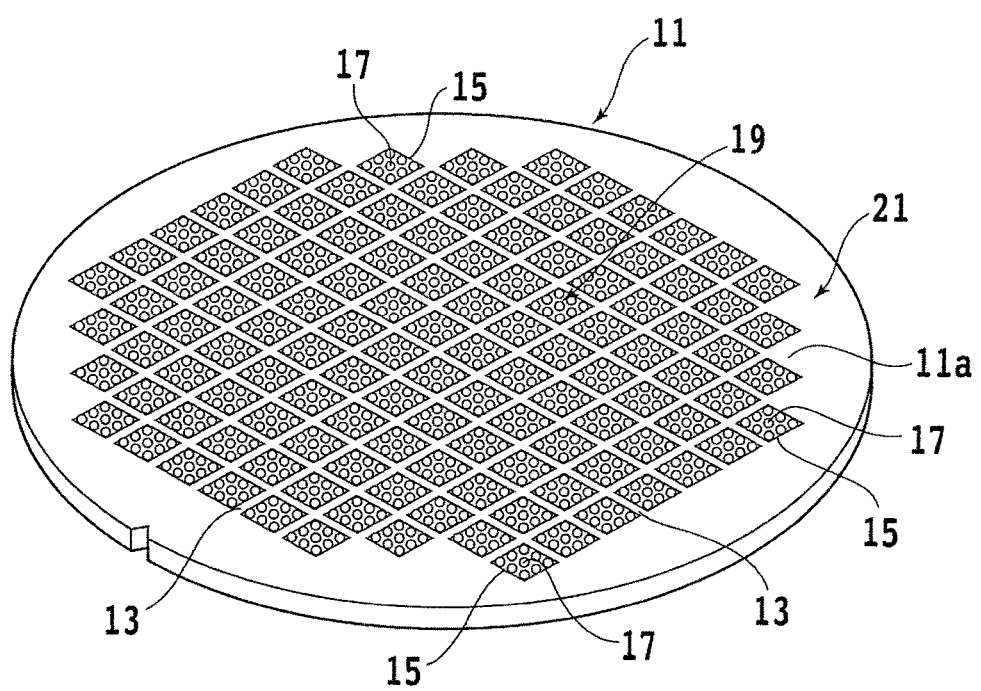
FIG. 2 is a perspective view of the front side of a wafer which has devices formed thereon, each of the devices having a plurality of electrode bumps.

FIG. 2 depicts in perspective the front side 11a of the semiconductor wafer 11 (also referred to simply as "wafer 11") which is suitable for being held under suction on the chuck table 24 according to the embodiment of the present invention. The front side 11a has a plurality of projected dicing lines (streets) 13 arranged in a grid pattern which demarcates the front side into a plurality of areas in a grid pattern in which devices 15 such as integrated circuits (ICs), large-scale integration (LSI) circuits, etc. are formed. Each of the devices 15 includes a plurality of electrode bumps 17. The front side 11a of the wafer 11 includes a device region 19 where the plurality of devices 15 with the electrode bumps 17 are formed and an outer peripheral extra region 21 surrounding the device region 19.

Figure 3:
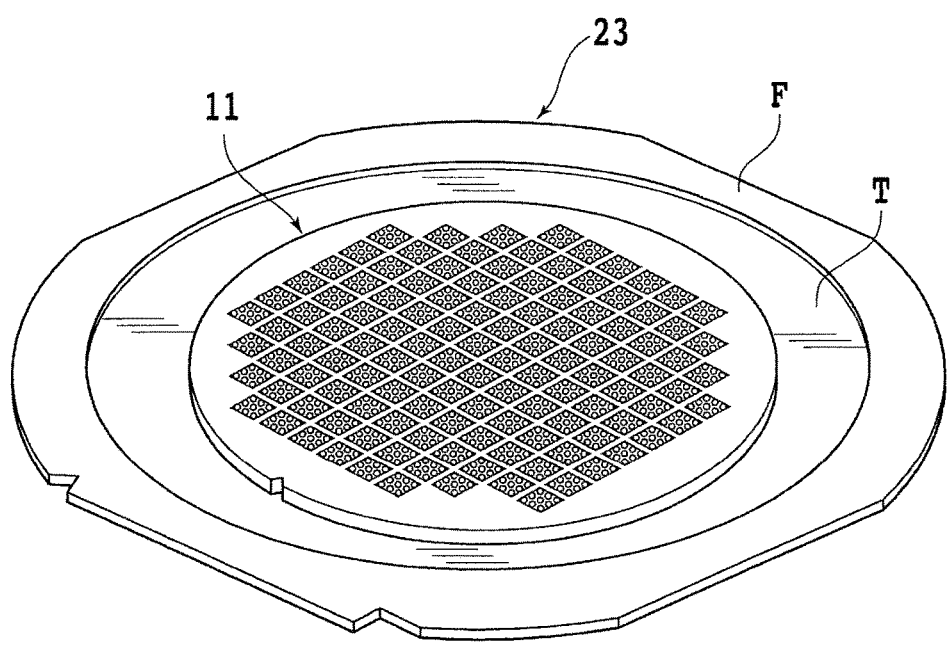
FIG. 3 is a perspective view of a frame unit in which the back side of the wafer is attached to a dicing tape whose outer peripheral portion is attached to an annular frame.

As depicted in FIG. 3, the wafer 11 is attached to a dicing tape T in the form of an adhesive tape. The dicing tape T has an outer peripheral portion attached to an annular frame F. In other words, the wafer 11 is handled as part of a frame unit 23 in which the wafer 11 is secured in an opening of the annular frame F by the dicing tape T. The dicing tape T is composed of a base made of a synthetic resin such as polyolefin or the like and coated with an adhesive layer.

Figure 4:
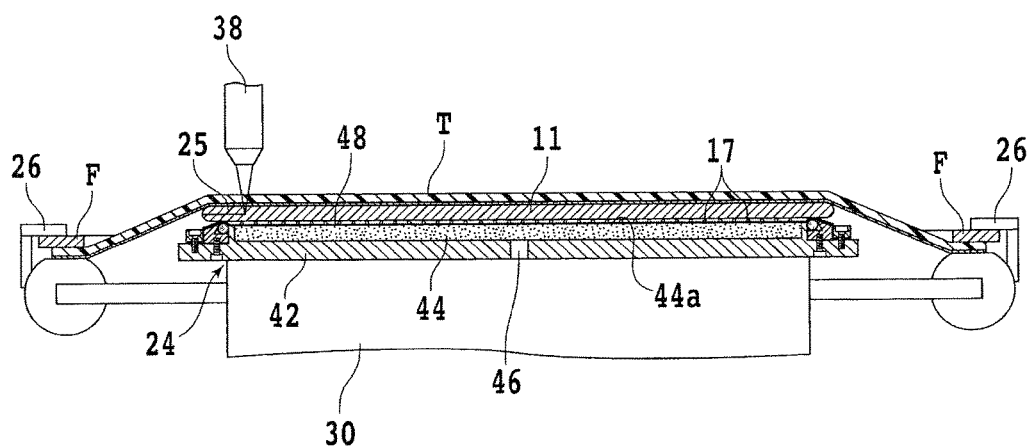
FIG. 4 is a cross-sectional view depicting the manner in which an electrode bump side of the frame unit is held under suction on the chuck table according to the embodiment of the invention.
Figure 5:
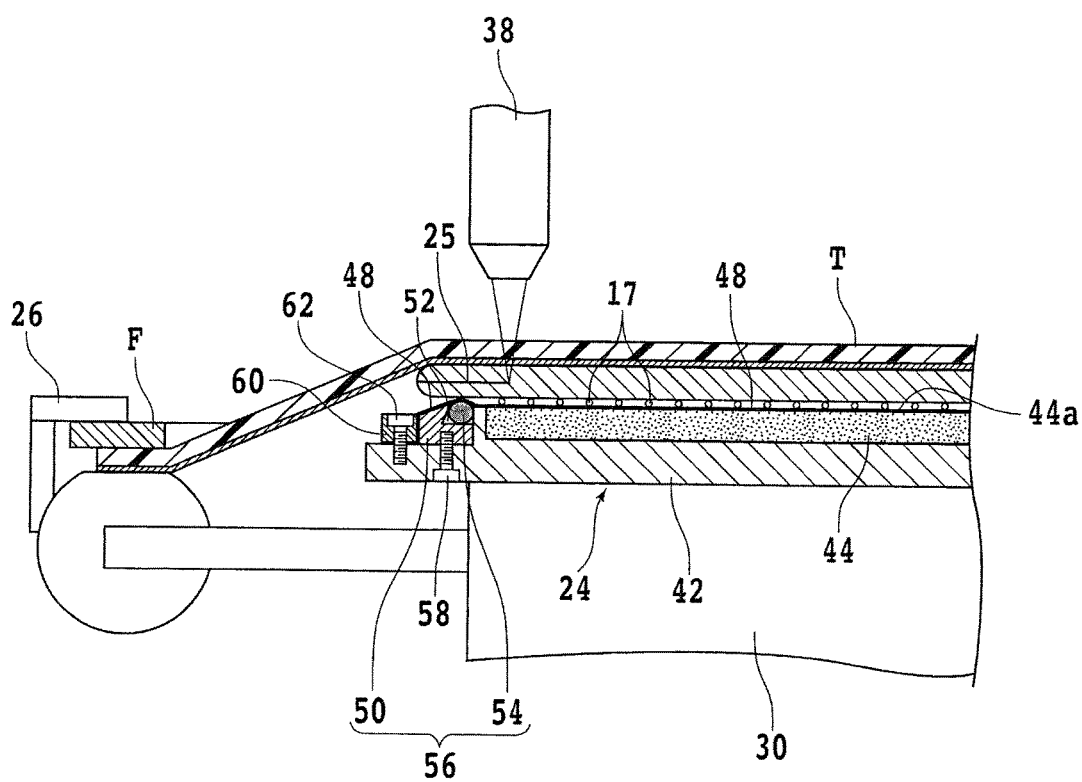
FIG. 5 is an enlarged fragmentary cross-sectional view of the chuck table depicted in FIG. 4.

The chuck table 24 according to the embodiment of the present invention will be described in greater detail below with reference to FIGS. 4 and 5. FIG. 4 depicts in cross section the manner in which the wafer 11 is held under suction on the chuck table 24 and a laser beam is applied to the wafer 11 through the dicing tape T that is attached to the back side of the wafer 11, forming a modified layer 25 within the wafer 11. FIG. 5 is an enlarged fragmentary cross-sectional view of the chuck table 24 depicted in FIG. 4.

The chuck table 24 which is disposed on the hollow cylindrical support 30 includes a frame body 42 made of a metal such as stainless steel (SUS) or the like and a suction holder 44 made of porous ceramics or the like and fitted in a recess defined in the frame body 42. The frame body 42 has a suction channel 46 defined therein which has an end held in fluid communication with the suction holder 44. The other end of the suction channel 46 is selectively connected to a suction source, not depicted, through a solenoid-operated selector valve, also not depicted.

In FIG. 4, the frame unit 23 that has been turned upside down is placed on the chuck table 24, and the front side 11a of the wafer 11 with the electrode bumps 17 formed thereon is held under suction on a holding surface 44a of the suction holder 44 with a sheet member 48 interposed therebetween, whereas the annular frame F of the frame unit 23 is clamped in position by the clamps 26.

The holding surface 44a of the suction holder 44 faces the electrode bumps 17 of the wafer 11, and attracts under suction the device region 19 of the wafer 11 placed on the chuck table 24. The outer peripheral extra region 21 of the wafer 11 is held in abutment against and supported by an O-ring 54 (see FIG. 5) that serves as an outer peripheral extra region support which projects toward the wafer 11 by a distance corresponding to the height of the electrode bumps 17.

The O-ring 54 is inserted and secured in an annular cutout 52 defined in an annular O-ring retainer 50. The O-ring retainer 50 and the O-ring 54 jointly serve as height adjusting means 56. The O-ring retainer 50 is fastened to an outer peripheral portion of the frame body 42 of the chuck table 24 by a plurality of screws 58 circumferentially spaced at given intervals.

The holding surface 44a of the chuck table 24 and the O-ring 54 as the outer peripheral extra region support are covered with the sheet member 48 which is greater in diameter than the wafer 11 and which is flexible and permeable to air. The sheet member 48 protects the front side 11a of the wafer 11.

The sheet member 48 has an outer periphery gripped in position between the O-ring retainer 50 and an annular sheet member holder 60. The sheet member holder 60 is fastened to the outer peripheral portion of the frame body 42 of the chuck table 24 by a plurality of screws 62 circumferentially spaced at given intervals. The sheet member holder 60 lowers the outer periphery of the sheet member 48 to a position lower than the O-ring 54 that serves as the outer peripheral extra region support and secures the outer periphery of the sheet member 48 in position on the outer peripheral portion of the frame body 42 in coaction with the O-ring retainer 50.

As described above, the O-ring retainer 50 and the O-ring 54 make up the height adjusting means 56. The distance by which the O-ring 54 projects from the holding surface 44a can be adjusted by changing the diameter of the O-ring 54 depending on the height of the electrode bumps 17, i.e., by selecting an O-ring 54 having a diameter depending on the height of the electrode bumps 17. The height of the electrode bumps 17 falls in a range from approximately 50 μm to 200 μm. The O-ring retainer 50 may be changed depending on the size of the O-ring 54.

With the chuck table 24 according to the embodiment, as described above, the electrode bumps 17 side of the wafer 11 is held on the holding surface 44a and the outer peripheral extra region 21 of the wafer 11 is supported by the O-ring 54 that serves as the outer peripheral extra region support. The O-ring 54 provides a seal between the wafer 11 and the holding surface 44a, allowing a sufficient negative pressure to act between the wafer 11 and the suction holder 44. Therefore, the chuck table 24 is capable of attracting under suction the front side 11a of the wafer 11 where the electrode bumps 17 are present from the electrode bumps 17 side.

Since the front side 11a of the wafer 11 is covered with the sheet member 48, the front side 11a of the wafer 11 is sufficiently protected when the wafer 11 is held under suction on the chuck table 24. Even if the height of the electrode bumps 17 is varied because devices of a different type are formed on the front side 11a of the wafer 11, the height of the outer peripheral extra region support can be adjusted by changing the O-ring 54. Accordingly, it is not necessary to prepare another chuck table for the different height of the electrode bumps 17.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A chuck table for holding under suction a front side of a wafer which has a device region including a plurality of devices, each having a plurality of electrode bumps, formed in a plurality of areas demarcated in a grid pattern, and an outer peripheral extra region surrounding the device region, comprising:
 a holding surface for facing the electrode bumps and holding under suction the device region of the wafer;
 a sheet member covering the holding surface;
 an outer peripheral extra region support surrounding the holding surface and including an O-ring and an O-ring retainer, the O-ring projecting beyond the holding surface for supporting the outer peripheral extra region of the wafer;
 the sheet member extending between the O-ring and the wafer and being secured between the O-ring retainer and an annular sheet member holder;
 wherein the O-ring retainer and the O-ring adjust the height of the O-ring so that the O-ring projects from the holding surface by a distance corresponding to the height of the electrode bumps.

* * * * *